United States Patent [19]

Coldren

[11] 4,325,038
[45] Apr. 13, 1982

[54] SAW RESONATOR FILTERS WITH IMPROVED TEMPERATURE STABILITY

[75] Inventor: Larry A. Coldren, Holmdel Township, Monmouth County, N.J.

[73] Assignee: Bell Telephone Laboratories, Incorporated, Murray Hill, N.J.

[21] Appl. No.: 191,155

[22] Filed: Sep. 26, 1980

[51] Int. Cl.³ .................. H03H 9/25; H03H 9/64; H03H 9/145
[52] U.S. Cl. .................................... 333/195; 333/155
[58] Field of Search ................................ 333/150–155, 333/193–196; 310/313 R, 313 A, 313 B, 313 C, 313 D, 346, 357, 366; 331/96, 107 A, 155, 163

[56] References Cited

U.S. PATENT DOCUMENTS

| | | | |
|---|---|---|---|
| 4,065,735 | 12/1977 | Palfreeman et al. | 333/195 |
| 4,166,228 | 8/1979 | Solie | 333/155 X |
| 4,191,934 | 3/1980 | Solie | 333/195 X |
| 4,272,742 | 6/1981 | Lewis | 333/155 |

OTHER PUBLICATIONS

Coldren et al.—"Monolithic Transversely Coupled SAW Resonator Filters", 1977 Ultrasonic Symposium Proceedings, IEEE Cat. #77 CH 1264-1 SU; pp. 888–893.
Coldren et al.—"SAW Resonator Filter Overview: Design and Performance Tradeoffs", 1978 Ultrasonic Symposium Proceedings, IEEE Cat. #78 CH 1344-1 SU; pp. 422–432.
Browning et al.—"A Novel Technique for Improving the Temperature Stability of SAW/SSBW Devices", 1978 Ultrasonic Symposium Proceedings, IEEE Cat. #78 CH 1344-1 SU; pp. 474–477.
Coldren et al.—"Surface-Acoustic-Wave Resonator Filters", Proceedings of the IEEE, vol. 67, No. 1, Jan. 1979, pp. 147–158.
Rosenberg et al.—"Scattering Analysis and Design of SAW Resonator Filters", IEEE Transactions on Sonics and Ultrasoncis, vol. SU-26, No. 3, May 1979, pp. 205–230.
Coldren—"Improved Temperature Stability in SAW Resonators Using Multiple Coupling Paths", Appl. Phys. Lett. 35(9), Nov. 1, 1979, pp. 678–680.
Coldren—"The Temperature Dependence of SAW Resonator Filters Using Folded Acoustic Coupling", reprinted from Ultrasonics Symposium Proceedings, Sep. 1979, pp. 830–835.

Primary Examiner—Marvin L. Nussbaum
Attorney, Agent, or Firm—Michael B. Einschlag

[57] ABSTRACT

Improvement in the temperature stability of a pair of resonator filters (70 and 71) disposed on an acoustic medium (39), which resonators are coupled by a first coupler means (500), is achieved by providing a second coupler means (501) for coupling between the resonator filters. The second coupler means is chosen so that acoustic interferences between waves propagating in the first and second coupling means compensates for the temperature variation in the propagation velocities of surface waves in different directions on the acoustic medium. The phase provided between second coupler means must be in near quadrature to the phase provided by the first coupler means.

In an embodiment constructed according to the present invention which utilizes parallel electromechanical (600) and folded acoustical intercavity couplers (72) to provide the necessary pair of different temperature coefficient paths, the restriction that the phases be in near quadrature provides nearly flat phase versus temperature characteristics over several tens of degrees centigrade.

11 Claims, 9 Drawing Figures

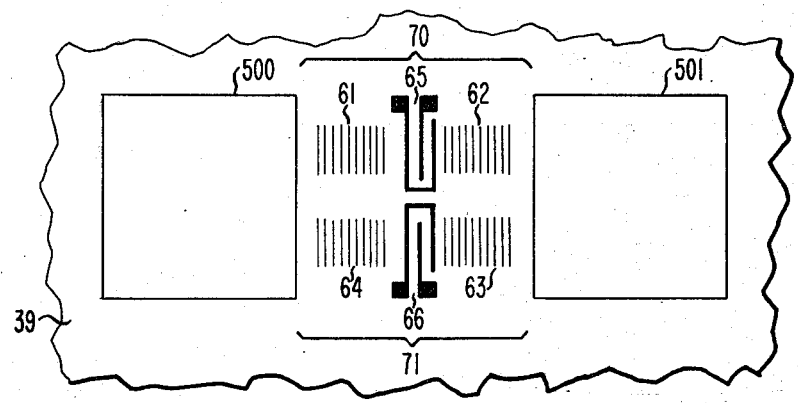
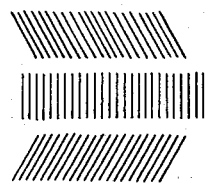
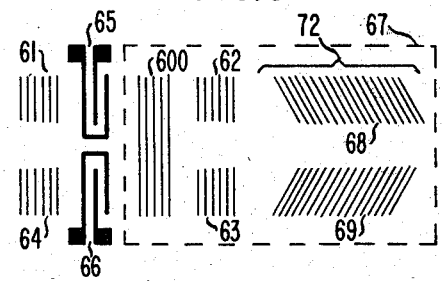
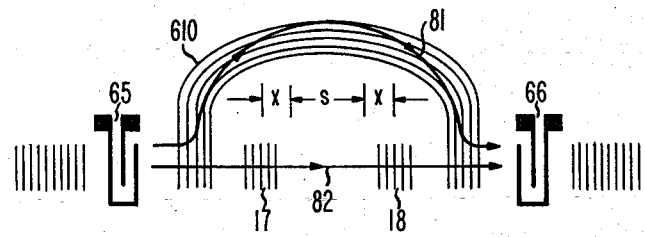
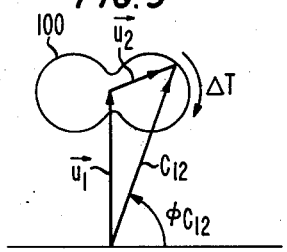
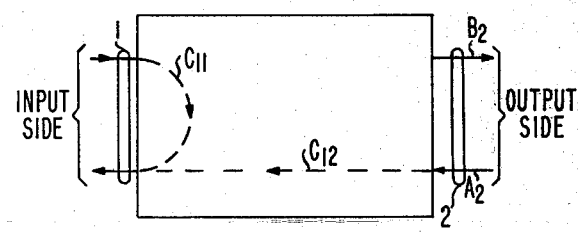

SAW RESONATOR FILTERS WITH IMPROVED TEMPERATURE STABILITY

BACKGROUND OF THE INVENTION

The present invention pertains to the field of surface acoustic wave (SAW) resonator filters.

Analyses of two-section SAW resonator filters with folded acoustic coupling have shown that these filters can provide an attractive combinations of filter characteristics. For example, the intercavity coupling level can be adjusted over a wide range to provide a wide range of filter bandwidths and proper design of an included U-path filter can provide a large out-of-band rejection.

The inherent temperature stability of these folded filters has been the subject of some concern because of the nonzero temperature coefficient of delay (TCD) path contained within the intercavity coupler, for example, see an article entitled "Monolithic Transversely Coupled SAW Resonator Filters," 1977 *Ultrasonics Symposium Proc.*, IEEE Pub., 77 CH 1264-1 SU, pp. 888–893, by L. A. Coldren, R. L. Rosenberg, and J. A. Rentschler. For a number of SAW applications, the inherent temperature stability offered by the commonly used ST-cut X-propagating quartz substrate is not good enough. In particular, analyses of high Q-SAW resonators show this to be particularly true in oscillator applications where a filter phase shift of 1° for a temperature shift of 1° C. is not unusual.

Furthermore, two-section folded filters have not been considered extensively for use in oscillator applications. They appear to have a number of advantages over one-section devices, for example, a ±90° tuning range is available over the 3-dB passband, the phase slope is doubled for a given bandwidth, the passband can be flat topped and better out-of-band rejection is possible in some configurations. However, as explained above with regard to filter applications, temperature stability is a problem.

SUMMARY OF THE INVENTION

Improvement in the temperature stability of a pair of resonator filters disposed on a medium, upon which surface waves propagate, which resonators are coupled by a first coupler means, is achieved by providing a second coupler means for coupling between the resonator filters. The second coupler means is chosen so that interference between waves propagating in the first and second coupling means compensates for the temperature variation in the propagation velocities of surface waves in different directions on the medium. Among other things, the phase provided by the second coupler means must be in near quadrature to the phase provided by the first coupler means.

An embodiment constructed according to the present invention which utilizes an electromechanical coupler and a folded acoustical intercavity coupler provides nearly flat phase versus temperature characteristics over several tens of degrees centigrade.

BRIEF DESCRIPTION OF THE DRAWING

A complete understanding of the present invention may be gained from a consideration of the detailed description presented hereinbelow in connection with the accompanying diagram in which:

FIG. 1 shows, in pictorial form, a generalized two-section filter embodiment of the present invention utilizing two coupling paths;

FIG. 2 shows, in pictorial form, a U-path filter, which filter may be used for intercavity coupling as means 500 in FIG. 1;

FIG. 3 shows, in pictorial form, a two filter embodiment of the present invention having an electromechanical multistrip intracavity coupler for the principal coupling path and a folded acoustic path intercavity coupler for the auxiliary coupling path;

FIG. 4 shows, in pictorial form, a "stretched-out" version of the embodiment shown in FIG. 3 for analysis;

FIG. 5 shows, in graphical form, the vector addition of the acoustic wave amplitudes of the principal and auxiliary coupling paths as a function of the variation of the auxiliary cavity phase;

FIG. 6 shows in diagrammatic form, the intercavity coupling network;

DETAILED DESCRIPTION

Figure 7:
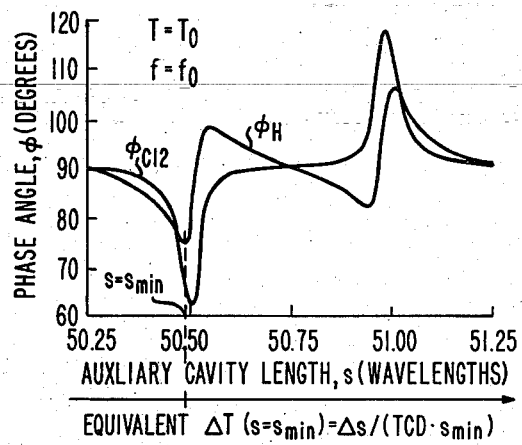
FIG. 7 shows, in graphical form, the phase variation of the vector sum of the acoustic wave amplitudes of the principal and auxiliary coupling paths and the phase variation of two-section filter output of the embodiment shown in FIG. 3 as a function of the auxiliary cavity length.

Temperature stability becomes a problem in wave devices, such as surface acoustical wave devices, where the propagation parameters along a given direction on a propagation medium vary with temperature. First attempts to solve this problem involved determination of specific orientations on the propagation medium along which the variations with respect to temperature are minimized. For example, ST-cut quartz has a direction of propagation along the X-direction which has a zero linear temperature variation. However, this direction has a second order temperature variation which makes this direction of propagation unsuitable for use in phase sensitive devices.

An article entitled "A Novel Technique for Improving the Temperature Stability of SAW/SSBW Devices," 1978 *Ultrasonics Symposium Proceedings*, IEEE Pub. Cat. No. 78 CH 1344-1 SU, pp. 474–477, by T. I. Browning and M. F. Lewis discloses acoustic wave devices in which temperature stability is significantly improved by utilizing two or more acoustic tracks, which acoustic tracks are connected in parallel electrically. When these acoustic tracks have different temperature coefficients of delay (TCD), the overall temperature coefficient of the device may be superior to that of the individual tracks, at least over a limited frequency and temperature range. The key aspect in the suggestion of the article is to choose the parameters of the acoustic tracks so that the electric signals interact at the electrical filter terminations to provide a temperature stable resultant.

My invention is an extension of the concept introduced by Browning and Lewis and comprises the provision of two or more coupler means for coupling energy in the device so that temperature compensation occurs in the form of surface wave interference within the device itself.

The coupling means are chosen so that they produce surface waves having properties which are dependent on temperature variations. However, the dependence on temperature variation is chosen to compensate for the temperature instabilities inherent in the rest of the device. Although I will describe my invention with respect to acoustic waves it should be clear to those skilled in the art that the invention also pertains to analogous optical wave devices. In the most general aspect of my invention, the coupling means may be provided by any one of a number of coupler means, as will be described hereinbelow.

For purposes of a convenient description of the present invention I will describe an embodiment which utilizes a two-section filter configuration disposed on surface wave medium 39 as shown in FIG. 1. Gratings 61 and 62 delimit a first resonant filter 70 containing transducer 65 and gratings 64 and 63 delimit a second resonant filter 71 containing transducer 66. Transducers 65 and 66 are the input and output ports of the device. Resonant filters 70 and 71 are aligned on the wave propagation medium so that the surface waves travel along parallel directions, which directions have a zero temperature coefficient of delay (TCD) in first-order and typically a non-zero TCD in second-order. Alternatively, filters 70 and 71 may lie along non-parallel directions, provided that these directions have nearly identical SAW characteristics. That is, the SAW velocity and TCD must be nearly the same.

Coupler 500 is a means for coupling energy between resonant filters 70 and 71. Although coupler 500 is shown to couple energy between filters 70 and 71 along a path outside the filters, it should be clear to those skilled in the art that coupler 500 could as well be placed internal to both cavities. Since I want to enhance the temperature stability of the output at transducer 66 as much as possible, I choose the particular physical embodiment for coupler 500 so that it provides a zero linear TCD for the filter. This can be accomplished by utilizing an internal coupler such as a multistrip coupler or a pair of transducer elements, both of which internal couplers are well known in the prior art and both of which add no temperature dependence due to surface wave propagation therethrough. I could also use an external coupler such as the three-bounce U-path filter shown in FIG. 2, which filter can be designed to have a zero linear TCD. For an embodiment utilizing a U-path filter or any external coupling means, gratings 61 and 64 would be shortened to provide the necessary transmission of energy. For non-parallel filters 70 and 71, the coupler 500 will have to be slightly modified in a way obvious to those skilled in the art.

Coupler 501 is an auxiliary means for coupling energy between resonant filters 70 and 71. Coupler 501 is used, along with primary coupler 500, to provide wave interference to compensate for the non-zero TCD in second order of resonant filters 70 and 71. I have discovered that the appropriate choice of physical characteristics for coupler 501 can produce a specific linear TCD variation which compensates for the second order TCD variation in the device. The methodology of the design choice and its physical manifestation in specific apparatus is explicated hereinbelow.

The invention can best be understood by considering the specific embodiment shown in FIG. 3 where the function of coupler 500 is performed by a parallel electromechanical multistrip internal coupler 600 and the function of coupler 501 is performed by a folded acoustical external intercavity U-path filter 72 comprising gratings 68 and 69. The U-path filter transmits energy on the wave propagation medium along a path having at least some portion with a non-zero linear TCD. Note that internal coupler 600 may be placed on either side of input and output transducers 65 and 66.

The analysis of the device shown in FIG. 3 is continued by referring to a "stretched-out" version shown in FIG. 4. The analysis need only cover the resonant passband where U-path filter 72 only adds flat loss. Line 81 shows that a first wave $\vec{U_1}$ propagates through path 610, the equivalent of multistrip coupler 600, from one resonant filter to the other. Line 82 shows that a second wave $\vec{U_2}$ propagates through the equivalent of U-path filter 72. Since FIG. 4 is a representation of the device shown in FIG. 3, one must bear in mind that the path between equivalent gratings 17 and 18 has a non-zero linear TCD and corresponds to the propagation of energy between slanted gratings 68 and 69 in FIG. 3 along the vertical direction. Equivalent arrays 17 and 18 combine the effects of gratings 62, 63, 68 and 69 in FIG. 3. The length x is the distance between the effective mirror planes in the short (gratings 62 and 63) and slanted (gratings 68 and 69) arrays. The length s corresponds to the vertical distance between gratings 68 and 69 in FIG. 3 and is the part of the path through the U-path filter which has a significant linear TCD.

I characterize the path between gratings 62 and 63 and through the U-path filter as an "auxiliary cavity." In accordance with the present invention I choose the phase of $\vec{U_1}$ and $\vec{U_2}$ to be near quadrature. In order to insure that waves $\vec{U_1}$ and $\vec{U_2}$ remain in substantial quadrature over the temperature range of interest, I require that the wave path for $\vec{U_2}$ be resonant and that the majority of the coupling between the main resonant cavities 70 and 71 be through the electromechanical coupler 600, where in this instance coupler 500 is shown positioned inside cavities 70 and 71.

The net fractional intercavity coupling, $C_{12}$, is the vector addition of $\vec{U_1}$ and $\vec{U_2}$. In order to explore the phase variation of $C_{12}$ with respect to temperature we need to plot the locus of the vector addition of $\vec{U_1}$ and $\vec{U_2}$ as a function of temperature. For illustrative purposes I have taken the temperature behavior of $\vec{U_1}$ to be that of ST-X quartz, which behavior is effectively temperature stable to first order. FIG. 5 shows the locus of $C_{12}$, i.e., curve 100, as a function of the auxiliary cavity phase, which phase variation is obtained by varying the length s+2x shown in FIG. 4. The phase variation of the auxiliary cavity due to temperature can be determined by the mathematically equivalent method of looking at length changes in propagation path. A complete transit around the locus, shown as curve 100 in FIG. 5, represents a deviation in the length s of λ, where λ is the wavelength of the surface waves. Curve 100 thus traces the effect of temperature variation on $\vec{U_2}$ and hence on $C_{12}$. It is important to note that I have not provided a temperature insensitive $C_{12}$. On the contrary, $C_{12}$ has a definite temperature variation. It is this important point which distinguishes my invention from that of Browning and Lewis. The temperature variation of $C_{12}$ is chosen so that the phase of $C_{12}$, i.e., $\phi_{C2}$, compensates for the phase variations of the device taken as a whole.

An exact parametric analysis of the device configuration shown in FIG. 3 is carried out according to the analysis shown in an article entitled "Scattering Analysis and Design of SAW Resonator Filters," *IEEE Trans. Sonics Ultrason*, Vol. SU-26, No. 3, pp. 205-230, May 1979, by R. L. Rosenberg and L. A. Coldren, which article is incorporated herein by reference.

FIG. 6 shows a representation of the coupling network between transducers 65 and 66 in FIG. 4 which appears in FIG. 3 of the Rosenberg-Coldren article. As is stated on p. 207 of that article the coupling network C has just two acoustic ports and the scattering behavior of the junction is given by $$B_m = \sum_{n=1}^{2} C_{mn} A_n, \quad m = 1,2 \tag{1}$$

where $C_{11}$ and $C_{22}$ are the amplitude reflection coefficients of the network, $C_{12}$ and $C_{21}$ are the transmission coefficients, and $A_n$ and $B_m$ are the input and output waves. The analysis of the article gives a transfer function:

$$H(f) = P_0^2 C_{12}/[(P_1 - P_2 C_{11})^2 - (P_2 C_{12})^2] \tag{2}$$

where the $P_j$'s, given in the article in terms of transducer, transmission line, and grating scattering parameters, describe the wave transmission of the device outside the coupling network surrounded by dotted line 67 in FIG. 3, which network is characterized by the $C_{ij}$'s.

For the device shown in FIG. 3, the scattering parameters of the coupling network are given by:

$$C_{11} = E_{11}(1 - 2c_M^2)\exp(-2j\beta l) + 2jE_{12}c_M(1 - c_M^2)^{\frac{1}{2}}\exp(-2j\beta l) \tag{3}$$

and $$C_{12} = 2jE_{11}c_M(1 - c_M^2)^{\frac{1}{2}}\exp(-2j\beta l) + E_{12}(1 - 2c_M^2)\exp(-2j\beta l) \tag{4}$$

where $E_{11}$ and $E_{12}$ are the reflection and transmission scattering parameters of the acoustically coupled resonator path formed by short grating pair 62 and 63, including the U-path shown in FIG. 3. The first term in EQ. 4 corresponds to the contribution of $\vec{U}_1$, and the second term corresponds to the contribution of $\vec{U}_2$. $E_{11}$ and $E_{12}$ are given by:

$$E_{11} = [G_{11} + (G_{12}^2 G_{11} t'^2)/(1 - G_{11}^2 t'^2)](1 - \alpha_c)^{\frac{1}{2}} \tag{5}$$

$$E_{12} = G_{12}^2 t'/(1 - G_{11}^2 t'^2). \tag{6}$$

In these equations, $c_M$ is the one-pass amplitude coupling of the multistrip coupler, $G_{11}$ and $G_{12}$ are the two-port scattering parameters of gratings 62 and 63, $\beta = 2\pi/\lambda$ is the SAW propagation constant, $t'$ is the transmission coefficient of the auxiliary cavity and $\alpha = 1 - |t'|^2$ and $\alpha_c$ are the one-way fractional power losses in the auxiliary and main cavities respectively.

FIG. 7 shows a plot of the phase of $H(f_0)$ and $C_{12}(f_0)$ as the length of the auxiliary cavity, s, is varied over one wavelength. The input-output transducers 65 and 66 are matched and optimally placed according to the analysis shown in the Rosenberg-Coldren reference. Here, $f = f_0$ represents the grating Bragg frequency as well as the passband center. For the plot shown in FIG. 7 the following parameters were used: $\alpha = 0.293$, $|G_{12}(f_0)| = 0.014$, $|\vec{U}_2|/|\vec{U}_1| = 0.54$ and $C_{12} = 0.102$ at $s = 50.5 \lambda$. The main cavity grating separations of $f_0$ are $71\lambda$, $\alpha_c = 0.03$ and $Q_F \sim 6100$.

In order to simulate the effects of a temperature change in the coupling network, I have normalized the wave propagation phases due to length to track the substrate temperature. I have assumed that the substrate is ST-cut quartz. Along the X direction, phase delays $\phi_i$ are assumed to have a parabolic temperature dependence and at the "turn-around" temperature of the parabolic curve, $T_0$, they are represented by $\phi_i = \phi_{i0}(1 + \gamma \Delta T)^2$, where $\Delta T$ is the temperature deviation from $T_0$ and $\gamma = 39.6 \times 10^{-9}/(°C.)^2$. Along the propagation direction perpendicular to X, phase delays $\phi_{j0}$ at $T_0$ are linear and represented by $\phi_j = \phi_{j0}(1 + \xi \Delta T)$ where $\xi = 46 \times 10^{-6}/(°C.)$. It is important to note that the plot of $\phi_{C12}$ in FIG. 7 provides an equivalent representation of the temperature variation of $\phi_{C12}$. At the same time the plot of $\phi_H$ in FIG. 7 provides an equivalent representation of the effect a temperature variation, appearing only in the coupling network, would have on the phase of device output. Thus the technique of making a plot of phase angle versus length of the auxiliary cavity has isolated the effect of the temperature dependence given by $C_{12}$. This technique allows one to see how to compensate, by means of an appropriate choice for $C_{12}$, for the effect of temperature variations in the main cavities so as to improve the temperature stability of the phase of $H(f)$.

FIG. 7 shows that the phase variations in $\phi_H$ do not closely follow the phase variation in $\phi_{C12}$. However, since $\phi_H$ and $\phi_{C12}$ are related we can approximate a temperature compensation condition for the temperature variations in the main cavities by more closely examining $C_{12}$. The minima in $\phi_H$ observed in FIG. 7 locate the potential auxiliary cavity lengths at which temperature compensation is possible (x is assumed to be an integer multiple of $\lambda$). If the shape of a minimum of $\phi_H$ on the equivalent temperature deviation scale of FIG. 7, $\Delta T$, is made to match the phase maximum normally provided by temperature variations on ST-X quartz over some range, then $\phi_H(\Delta T)$ will remain constant over this $\Delta T$ range. This result is obtained because $\phi_H$, as shown in FIG. 7, indicates how $\phi_H$ will vary due to temperature variation effects on $C_{12}$. Thus the shape of $\phi_H$, as shown in FIG. 7, is used as a design aid in determining what parameters must be chosen for the coupling network to give the desired shape to compensate for the parabolic temperature variation in the main cavities. Of course, implicit in this analysis is the inherent feature of a linear, passive filter that the effect of temperature on the phase of $H(f)$ due to the main cavities and $C_{12}$ may be superimposed.

Since I know that the variation of ST-X versus T provides a parabolic maximum in the resonant phase response, I seek a quasi-parabolic minimum in $\phi_H$, as shown in FIG. 7, which is caused by a dip in $\phi_{C12}$ when I vary only the temperature of the auxiliary cavity path. Then when the temperature of the entire device is allowed to change, the dip introduced by the $C_{12}$ variation compensates for the maximum which would normally occur in $\phi_H$ without an auxiliary path. However, the observed nonparabolic shape of the $\phi_H$ minima will limit the range and quality of the compensation. It is important to realize that the magnitude response is not necessarily compensated at the same time as the phase in these nonminimum phase filters. The magnitude response actually suffers some degree of distortion as the dip in $\phi_H$, as shown in FIG. 7, is increased. For these reasons, phase compensation down to about 15° from the ST-X characteristic maximum appears to be near a practical limit.

In order to compensate the normally observed parabolic maximum in $\phi_H$ versus temperature at $T_0$, the length of the auxiliary U-path cavity must be chosen properly. As the length is adjusted, the overall filter phase characteristic $\phi_H$ experiences minima just below each resonant condition in the auxiliary U-path cavity phase $\phi_{C12}$, as shown in FIG. 7. If the length of the auxiliary cavity is fixed at some value and the temperature is varied, the phase $\phi_{C12}$ will be swept by the linear TCD of the vertical transit. Now, in order to compensate the normal parabolic ST-X maximum, the shape, or width, of the artificially-produced minimum in $\phi_H$ shown in FIG. 7 must also match. The shape of the minimum of $\phi_H$ shown in FIG. 7 is determined by auxiliary cavity losses and the length of the non-zero TCD path, denoted by s in FIG. 4. In order to keep losses as low as possible, the shape of the minimum of $\phi_H$ shown in FIG. 7 is adjusted by increasing or decreasing s in wavelength multiples to select the proper value, $s = s_{min}$, at which the shape of the minimum most closely matches the ST-X parabolic characteristic.

Figure 8:
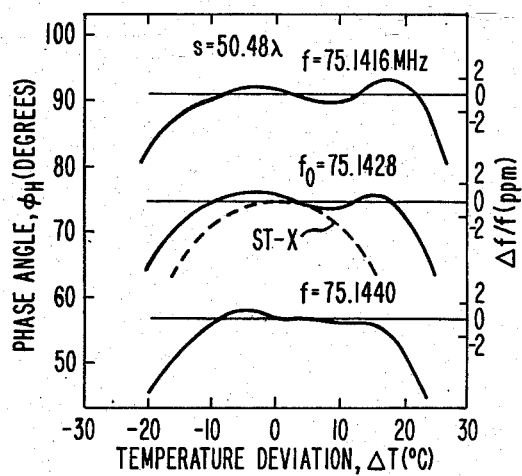
FIG. 8 shows, in graphical form, the phase of the transfer function H(f) for a filter compensated according to the present invention at three passband frequencies versus the temperature deviation from the point of inflection for the parabolic temperature variation ΔT on ST quartz.
Figure 9:
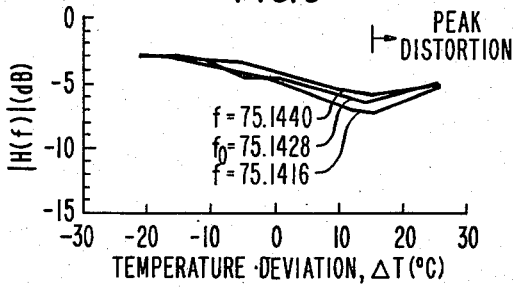
FIG. 9 shows, in graphical form, the magnitude of the transfer function H(f) for a filter compensated according to the present invention at three passband frequencies versus the temperature deviation from the point of inflection for the parabolic temperature variation ΔT on ST quartz.

FIGS. 8 and 9 show example graphs of phase and magnitude versus $\Delta T$ responses at three different passband frequencies calculated for a filter that uses the type of compensation described hereinabove. At $f_0$ one observes only a $\pm 1°$ phase variation over a range of about 30° C. The characteristics at other frequencies, which span about 20% of the passband, indicate the degree to which the compensation holds over the passband. The reduction in filter transmission for higher temperatures evident in FIG. 9 results from the reduction of $|C_{12}|$, which reduction occurs above the peak deviation in $\phi_{C12}$ as can be seen from curve 100 in FIG. 5. The accompanying spread in the magnitude characteristics over the three frequencies indicates a significant sloping of the passband. This sloping can be partially compensated by asymmetrical adjustment of the input and output transducers.

The design of temperature compensated filters requires the determination of a number of parameters that set the filter geometry. For a given filter bandwidth, or phase slope, one must determine the transmission of the coupling gratings $|G_{12}|$, the net coupling of the multistrip $2|E_{11}|c_M(1-c_M^2)^{\frac{1}{2}}$, and the non-zero TCD auxiliary cavity length $s = s_0$ at $\Delta T = 0$. The following general design considerations affect this determination:

1. The auxiliary cavity loaded Q, $Q_{AL}$, must be somewhat less than the net filter Q, $f_0/\Delta f = Q_F$, to provide for compensation over the bandpass, 2. there is a practical maximum in the amount of phase dip in $\phi_{c12} \sim \pi/6$ because of magnitude response distortions, and 3. the phase dip in $\phi_{c12}$, for a wide range of parameters, is always about twice as large and half as wide as the corresponding dip in $\phi_H$ for plots similar to that shown in FIG. 7.

In a two-section resonator the "normal" passband phase variation $\Delta \phi_H$ due to temperature changes is given approximately by $$\Delta \phi_H (\Delta T) \approx \pi Q_F \gamma (\Delta T)^2, \qquad (7)$$

where $\gamma = -39.6 \times 10^{-9}/(°C.)^2$ for ST-X quartz. Thus, I use the phase equivalence between length and temperature variation in the auxiliary cavity, $\Delta T = (s - s_{min})/(TCD s_{min})$, to solve for the shape of the $\phi_H$ minimum in FIG. 7 required to compensate for the "normal" phase variation given by EQ. 7. Relating this requirement back to the desired grating and cavity length I have found that $$|G_{12}|^2 \approx T_{aux} \alpha / (1 - T_{aux}) \qquad (8)$$

and $$s_0 = \lambda \alpha (-Q_F \Gamma / \theta_{max})^{\frac{1}{2}} / (3\, TCD (1 - T_{aux})) \qquad (9)$$

while the net coupling of the auxiliary coupling path $T_{aux} = |C_{12}| \sin \theta_{max}$, and the net multistrip coupler coupling $T_{CM} = |C_{12}| \cos \theta_{max}$ for a maximum phase dip in $\phi_{C12} = \theta_{max}$. In practice $\theta_{max}$ is $\lesssim \pi/6$. I note that $|C_{12}|$ is given by the required filter $Q_F$ and main cavity length as determined in accordance with the Rosenberg-Coldren reference. The dependence on $\alpha$ given by EQS. 8 and 9 indicates a degree of freedom that may be used to trim a finished filter, for example, by shortening the U-path.

The final step in determining the appropriate filter design is a small adjustment in s to set $s_0 = s_{min}$ near to an odd numbered, auxiliary cavity resonance as shown in FIG. 7. The minima of $\phi_H$ near even numbered resonances are accompanied by more severe peak distortion. A first design value for $s_{min}$ can be chosen at the lower inflection in $\phi_{C12}$.

One design limitation that results if one requires $Q_{AL} \lesssim Q_F/2$ is $$Q_F \gtrsim -[16 \pi \gamma / \theta_{max} (TCD)^2] / [1 + (2x/s_0)^2]. \qquad (10)$$

For ST quartz with TCD = 46 ppm normal to the X axis, $\theta_{max} = \pi/6$, $2x/s_0 \gtrsim 1$, EQ. 10 gives $Q_F \gtrsim 3600$. At this lower $Q_F$ extreme, compensation similar to that shown in FIG. 8, should extend over a range of about $(6100/3600)\, 30°\, C. \approx 50°\, C.$

I claim:

1. A temperature stable coupled resonator which comprises:
   a medium (39) on which surface waves propagate;
   grating means (61, 62, 63, 64) disposed on said medium for forming first and second grating resonators for said surface waves; and
   first means (500) for coupling resonant wave energy from each resonator into the other resonator;
   means (65) for introducing energy into said coupled resonator; and
   means (66) for extracting energy from said coupled resonator
   characterized in that said coupled resonator further includes
   second means (501) for coupling resonant wave energy in each resonator out of that resonator along its axis and into the other resonator along its axis, the phase of the wave energy out of said second means being substantially in quadrature to the phase of the wave energy out of said first means.

2. A temperature stable coupled resonator in accordance with claim 1 wherein said first coupling means has a zero linear temperature coefficient of delay.

3. A temperature stable coupled resonator in accordance with claim 2 wherein said second coupling means has a linear temperature coefficient of delay.

4. A temperature stable coupled resonator in accordance with claim 3 wherein said first and second grating resonators are aligned along directions on said medium having zero linear temperature coefficients of delay.

5. A temperature stable coupled resonator in accordance with claim 4 wherein said first and second grating resonators are aligned along parallel directions on said medium.

6. A temperature stable coupled resonator in accordance with claim 5 wherein said first coupling means is a multistrip coupler.

7. A temperature stable coupled resonator in accordance with claim 5 wherein said first coupling means is a transducer coupling means.

8. A temperature stable coupled resonator in accordance with claim 5 wherein said first coupling means is an external three bounce U-path filter.

9. A temperature stable coupled resonator in accordance with claim 6 wherein said second coupling means is a two bounce U-path filter.

10. A temperature stable coupled resonator in accordance with claim 9 wherein said medium is ST-X cut quartz and said first and second grating resonators are aligned along the X direction.

11. A temperature stable coupled resonator in accordance with claim 9 wherein said equivalent length, $s_0$, of said two bounce U-path filter is substantially equal to $\lambda\alpha(-Q_F\gamma/\theta_{max})^{\frac{1}{2}}/(3\ TCD\ (1-T_{aux}))$ where $\lambda$ is the wavelength of the surface waves, $\alpha$ is the one-way fractional power loss in said two bounce U-path filter, $Q_F$ is the net filter Q, $\gamma$ is the parabolic temperature variation, $\theta_{max} \lesssim \pi/6$, TCD is the linear temperature coefficient of delay of the second coupling means and $T_{aux}$ is the net coupling of said two-bounce U-path filter.

* * * * *

UNITED STATES PATENT AND TRADEMARK OFFICE
CERTIFICATE OF CORRECTION

PATENT NO. : 4,325,038
DATED : April 13, 1982
INVENTOR(S) : Larry Allen Coldren

It is certified that error appears in the above—identified patent and that said Letters Patent is hereby corrected as shown below:

Column 8, line 15, that portion of the formula reading
$(-Q_F \Gamma /$ should read $(-Q_F \gamma /$ Column 8, line 40, that portion of the formula reading
$2x/s_0 \gtrsim 1$ should read $2x/s_0 \sim 1$ Signed and Sealed this Seventh Day of December 1982

[SEAL]

Attest:

GERALD J. MOSSINGHOFF

Attesting Officer  Commissioner of Patents and Trademarks